United States Patent
Heo

(10) Patent No.: US 11,101,718 B2
(45) Date of Patent: Aug. 24, 2021

(54) MOTOR ROTATION DETECTION DEVICE

(71) Applicant: MANDO CORPORATION, Gyeonggi-do (KR)

(72) Inventor: Jae-Young Heo, Gyeonggi-do (KR)

(73) Assignee: MANDO CORPORATION, Gyeonggi-do (KR)

( * ) Notice: Subject to any disclaimer, the term of this patent is extended or adjusted under 35 U.S.C. 154(b) by 47 days.

(21) Appl. No.: 16/426,996

(22) Filed: May 30, 2019

(65) Prior Publication Data

US 2019/0372434 A1 Dec. 5, 2019

(30) Foreign Application Priority Data

May 31, 2018 (KR) .......... 10-2018-0062598

(51) Int. Cl.
*H02K 11/215* (2016.01)
*G01R 33/02* (2006.01)

(52) U.S. Cl.
CPC ........... *H02K 11/215* (2016.01); *G01R 33/02* (2013.01)

(58) Field of Classification Search
CPC .................................................. H02K 11/215
See application file for complete search history.

(56) References Cited

U.S. PATENT DOCUMENTS

| | | | | |
|---|---|---|---|---|
| 8,552,675 B2 * | 10/2013 | Asahi | ..................... | H02K 29/08 318/400.39 |
| 8,717,011 B2 * | 5/2014 | Henning | ................ | G01D 5/145 324/207.25 |
| 9,444,313 B2 * | 9/2016 | Taniguchi | ................ | H02K 5/04 |
| 9,954,421 B2 * | 4/2018 | Roos | ......................... | F16D 1/06 |
| 10,075,037 B2 * | 9/2018 | Ichikawa | ............. | G01D 11/245 |
| 10,222,234 B2 * | 3/2019 | Spitzer | ..................... | G01B 7/30 |
| 2008/0272660 A1 * | 11/2008 | Becker | ...................... | G01P 1/04 310/43 |
| 2011/0181221 A1 * | 7/2011 | Asahi | ................... | H02K 11/215 318/400.39 |
| 2018/0152088 A1 * | 5/2018 | Suzuki | ................... | H02K 29/08 |
| 2018/0299296 A1 * | 10/2018 | Mori | ....................... | H01F 1/057 |
| 2019/0061117 A1 * | 2/2019 | Muramatsu | .......... | H02K 11/215 |
| 2020/0153368 A1 * | 5/2020 | Kobayashi | ............ | H02K 5/225 |
| 2020/0169143 A1 * | 5/2020 | Yamamoto | .............. | G01D 5/12 |

* cited by examiner

*Primary Examiner* — Alexander Talpalatski
(74) *Attorney, Agent, or Firm* — Ladas & Parry, LLP

(57) ABSTRACT

A motor rotation detection device is disclosed. The motor rotation detection device according to one embodiment of the present invention, which is coupled to a rotating shaft of a motor to transmit a rotation position of a motor to a motor position sensor (MPS) through magnetic flux in a non-contact manner, includes: a spacer that is disposed so that one end thereof is in contact with one end of the rotating shaft; a sensor magnet that is disposed on the other end of the spacer and generates magnetic flux; and a case that is coupled to the rotating shaft and provides a fixing force to fix the sensor magnet and the spacer to the rotating shaft.

9 Claims, 6 Drawing Sheets

MOTOR ROTATION DETECTION DEVICE

CROSS-REFERENCE TO RELATED APPLICATION

This application claims priority to and the benefit of Korean Patent Application No. 10-2018-0062598, filed on May 31, 2018, the disclosure of which is incorporated herein by reference in its entirety.

BACKGROUND

1. Field of the Invention

The present invention relates to a motor rotation detection device, and more specifically, to a motor rotation detection device which transmits a rotation position of a rotating shaft of a motor to a motor position sensor (MPS) through magnetic flux in a non-contact manner.

2. Discussion of Related Art

Generally, motor position information should be transmitted to an electronic control unit (ECU) to control a motor installed in a vehicle. The ECU controls the motor based on the rotation position information received from the motor.

Therefore, a sensor magnet is disposed on a rotating shaft of the motor to detect a rotation position of a motor. The sensor magnet is coupled to the rotating shaft of the motor to transmit magnetic flux to a motor position sensor (MPS) of the ECU in a non-contact manner.

Conventionally, a plurality of components, a complicated structure, and the like have been required to couple a sensor magnet to a rotating shaft of a motor. In this situation, the development of technology that allows a sensor magnet for detecting the rotation of a motor to be coupled to a rotating shaft of the motor through a simple structure has been required.

SUMMARY OF THE INVENTION

The present invention is directed to a motor rotation detection device which may be lightweight, reduce component costs, and have excellent resistance to separating due to a rigid coupling structure.

The present invention is directed to a motor rotation detection device which allows a sensor magnet to have an enlarged size so as to have an improved performance that detects a rotation position of the motor sensor magnet.

According to an aspect of the present invention, there is provided a motor rotation detection device which is coupled to a rotating shaft of a motor to transmit a rotation position of the motor to a motor position sensor (MPS) through magnetic flux in a non-contact manner, the device including a spacer which is disposed so that one end thereof is in contact with one end of the rotating shaft, a sensor magnet which is disposed on the other end of the spacer and generates magnetic flux, and a case which is coupled to the rotating shaft and provides a fixing force so that the sensor magnet and the spacer are fixed to the rotating shaft.

The spacer may be made of a non-magnetic material.

The spacer may be made of an elastic material.

The spacer may include a protrusion that is formed to protrude from one end thereof, and a groove, into which the protrusion is inserted, may be formed on one end of the rotating shaft.

The sensor magnet may be disposed to cover an entirety of the other end of the spacer.

A guide protrusion may be formed on any one of the other end of the spacer and a contact surface of the sensor magnet that is in contact with the other end of the spacer, and a guide groove, into which the guide protrusion is inserted, may be formed in the other end thereof.

The case may be made of a non-magnetic metal material.

The case may include a head part which covers one surface of the sensor magnet and a body part which extends downward from the head part and is formed to surround the sensor magnet, the spacer, and a part of the rotating shaft.

The head part may include a window that exposes at least a part of the sensor magnet.

The rotating shaft may include a groove formed in a portion, which is in contact with an inner circumferential surface of the body part, of an outer circumferential surface thereof, and the body part may include a protrusion which is formed on a portion, which is in contact with the groove, of an inner circumferential surface thereof and may be formed to be insertion-fixable to the groove.

A motor rotation detection device which is coupled to a rotating shaft of a motor to transmit a rotation position of a motor to a motor position sensor (MPS) through magnetic flux in a non-contact manner, the device including a holder which has one end coupled to one end of the rotating shaft, and a sensor magnet which is coupled to the other end of the holder and generates magnetic flux.

The holder may be made of a non-magnetic material.

The holder may include a protrusion which is formed to protrude from one end thereof and a groove, into which the protrusion is inserted, is formed in one end of the rotating shaft.

The holder may include a mounting groove formed in the other end thereof so that the sensor magnet is mounted therein.

A guard may be formed on an upper end of the mounting groove to protrude inward in a radial direction so as to prevent the sensor magnet from being separated from the mounting groove.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
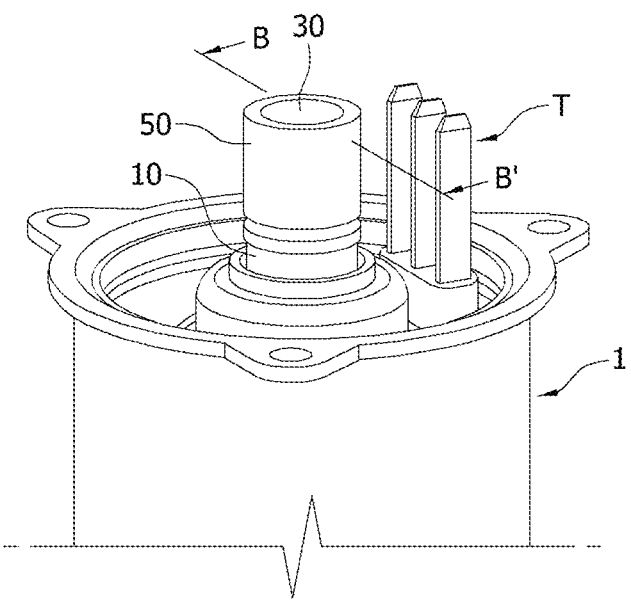
FIG. 1 is a perspective view of a motor rotation detection device according to one embodiment of the present invention.

Hereinafter, embodiments that are easily performed by those skilled in the art will be described in detail with reference to the accompanying drawings. However, the embodiments of the present invention may be implemented in several different forms and are not limited to the embodiments described herein. In addition, parts irrelevant to description will be omitted in the drawings to clearly explain the embodiments of the present invention. Similar parts are denoted by similar reference numerals throughout this specification.

In this specification, it should be understood that the term "comprise" or "have" specifies the presence of stated features, numerals, operations, components, parts, or a combination thereof but do not preclude the presence or addition of one or more other features, numerals, operations, components, parts, or a combination thereof.

In FIGS. 1 to 4, a motor rotation detection device according to one embodiment of the present invention is shown. The motor rotation detection device according to one embodiment of the present invention is coupled to a rotating shaft of a motor to transmit a rotation position of the motor to a motor position sensor (MPS) 5 through magnetic flux in a non-contact manner.

Referring to FIGS. 1 to 4, the motor rotation detection device according to one embodiment of the present invention includes a spacer 40, a sensor magnet 30, and a case 50.

The spacer 40 is disposed so that one end thereof is in contact with one end of a rotating shaft 10. In one embodiment of the present invention, the spacer 40 separates the sensor magnet 30 having a magnet from the rotating shaft 10 having weak magnetism. Specifically, the overall shape of the spacer 40 may be a cylindrical shape in which one end of the rotating shaft 10 is extended.

The spacer 40 may be made of a non-magnetic material. Since the spacer 40 serves to separate the sensor magnet 30 from the rotating shaft 10 that has magnetism, the spacer 40 may be made of a non-magnetic material.

Figure 2:
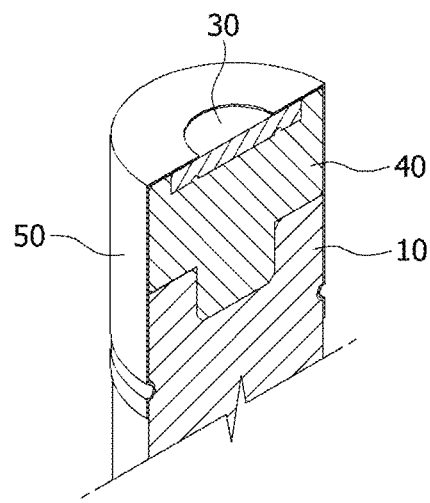
FIG. 2 is a cross-sectional perspective view taken along line B-B' in FIG. 1.
Figure 3:
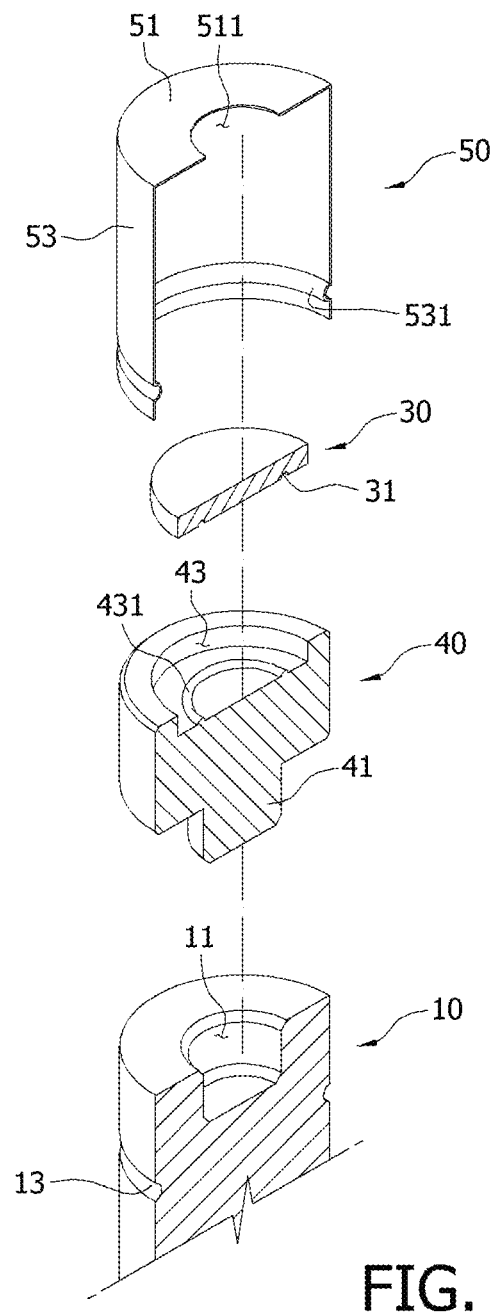
FIG. 3 is an exploded perspective view showing a cross section taken along line B-B' in FIG. 1.
Figure 4:
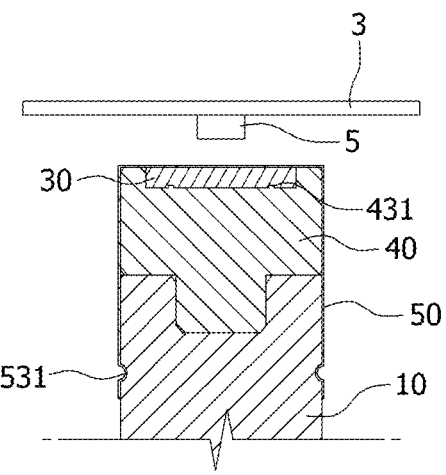
FIG. 4 shows a cross-sectional view taken along line B-B' in FIG. 1 with an electronic control unit (ECU) to which a motor position sensor (MPS) is coupled.

In one embodiment of the present invention, the spacer 40 may be insertion-coupled to one end of the rotating shaft 10. Referring to FIGS. 2 to 4, the spacer 40 includes a protrusion 41 that protrudes from one end thereof. To correspond to the protrusion 41, a groove 11 is formed in one end of the rotating shaft 10 to which the spacer 40 is coupled so that the protrusion 41 is inserted thereinto. More specifically, the protrusion 41 may be press-fitted and coupled to the groove 11. That is, the protrusion 41 of the spacer 40 is press-fitted to the groove 11, and thus the spacer 40 may be coupled to the rotating shaft 10.

Further, the spacer 40 may be made of an elastic material. As described below, the motor rotation detection device according to one embodiment of the present invention may be fixed to the rotating shaft 10 using the case 50. Thus, it is not necessary that the spacer 40 is made of a hard metal material so as to serve to fix the sensor magnet 30. Therefore, when the spacer 40 is made of a non-magnetic elastic material such as rubber, the motor rotation detection device can be made to be lightweight and reduce costs for materials and processes. Further, when the spacer 40 is made of an elastic material, a gap due to expansion and contraction because of temperature can be minimized Meanwhile, in one embodiment of the present invention, the spacer 40 includes a mounting groove 43 formed in the other end thereof so that the sensor magnet 30 is mounted therein. According to one embodiment of the present invention, the sensor magnet 30 and the spacer 40 are covered by the case 50 and coupled to the rotating shaft 10 of a motor 1, and thus it is not necessary that an adhesive for adhesion of the sensor magnet 30 is applied between the mounting groove 43 and the sensor magnet 30.

To stably mount the sensor magnet 30, a guide protrusion 431 may be formed on any one of the mounting groove 43 and an inner end of the sensor magnet 30 that comes into contact with the mounting groove 43, and a guide groove 31 into which the guide protrusion 431 is inserted may be formed in the other one thereof. Referring to FIG. 3, in one embodiment of the present invention, the guide protrusion 431 is formed on the mounting groove 43, and the guide groove 31 is formed in the sensor magnet 30.

The sensor magnet 30 is disposed on the other end of the spacer 40 and generates magnetic flux. A rotation position of the motor is transmitted to the MPS 5, which is coupled to an electronic control unit (ECU) 3, through the magnetic flux generated by the sensor magnet 30 in a non-contact manner.

Meanwhile, as described above, the guide groove 31 may be formed in a contact surface of the sensor magnet 30 that comes into contact with the mounting groove 43 of the spacer 40.

Figure 5:
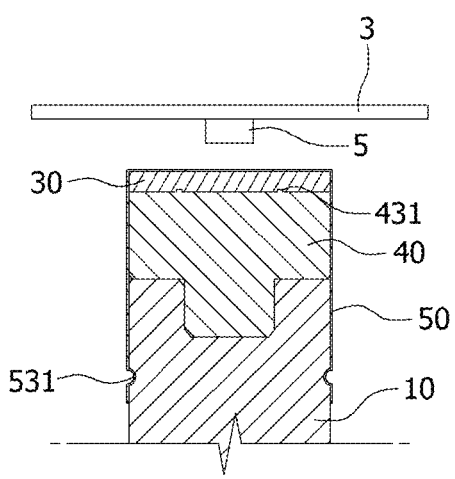
FIG. 5 is a cross-sectional view of a modified example of the motor rotation detection device according to one embodiment of the present invention.

FIG. 5 is a view showing a modified example of the motor rotation detection device according to one embodiment of the present invention. Referring to FIG. 5, a sensor magnet 30 is disposed to cover an entirety of the other end of a spacer 40. That is, a mounting groove 43 is not formed on the other end of the spacer 40, and the sensor magnet 30 having a size and shape that cover the entirety of the other end of the spacer 40 may be disposed.

According to one embodiment of the present invention, the sensor magnet 30 and the spacer 40 fixedly cover a rotating shaft 10 by a case 50 which is coupled to the rotating shaft 10 of a motor 1, and thus it is not necessary that the spacer 40 includes the mounting groove 43 formed in the other end thereof, wherein the sensor magnet 30 is mounted in the mounting groove 43. As shown in the modified example, the size of the sensor magnet 30 may be increased to the size that covers the entirety of the other end of the spacer 40. As an area of the magnet is increased, a magnetic force is increased, and thus the rotation position of the motor 1 can be more accurately transmitted.

Of course, even in this case, to stably mount the sensor magnet 30, a guide protrusion 431 is formed on any one of the other end of the spacer 40 and an inner end of the sensor magnet 30 that comes into contact with the other end thereof, and a guide groove 31 into which the guide protrusion 431 is inserted may be formed in the other end thereof. In the modified embodiment of FIG. 5, the guide protrusion 431 is formed on the other end of the spacer 40, and the guide groove is formed in a contact surface of the sensor magnet 30.

The case 50 is coupled to the rotating shaft 10 and provides a fixing force so that the sensor magnet 30 and the spacer 40 are fixed to the rotating shaft 10. The case 50 may be formed in a cylindrical cap shape having one open side. The case 50 covers the sensor magnet 30 and the spacer 40 in a surrounding manner and is coupled to the rotating shaft 10 of the motor 1 so as to fix the motor rotation detection device according to one embodiment of the present invention to the rotating shaft 10.

In the other words, according to one embodiment of the present invention, due to a rigid coupling structure by the case 50, the spacer 40 that is made of a non-magnetic elastic material may be used and an adhesive layer for fixing the sensor magnet 30 may be omitted. Further, as described above, according to one embodiment of the present invention, a limitation in the size of the sensor magnet 30 is alleviated, and thus the rotation position can be more accurately transmitted due to increase in the size of the sensor magnet 30.

More specifically, the case 50 may include a head part 51 that covers one surface of the sensor magnet 30 and a body part 53 formed to surround the sensor magnet 30, the spacer 40, and a part of the rotating shaft 10.

In this case, the head part 51 may include a window 511 that exposes a part of the sensor magnet 30. The window 511 allows magnetic flux of the sensor magnet 30 to be transmitted more easily without interruption from the case 50.

Further, since the rotating shaft 10 has a groove 13 formed in a portion, which is in contact with an inner circumferential surface of the body part 53, of an outer circumferential surface thereof, the body part 53 includes a protrusion 531 formed on a portion, which is in contact with the groove 13, of an inner circumferential surface thereof. Such a coupling form may be made by a clinching process or the like.

Meanwhile, the case 50 may be made of a non-magnetic metal material. When the case 50 is a magnetic material, magnetism leaks, and thus it is hard to accurately transmit the rotation position. Specifically, a non-magnetic stainless metal may be used.

Figure 6:
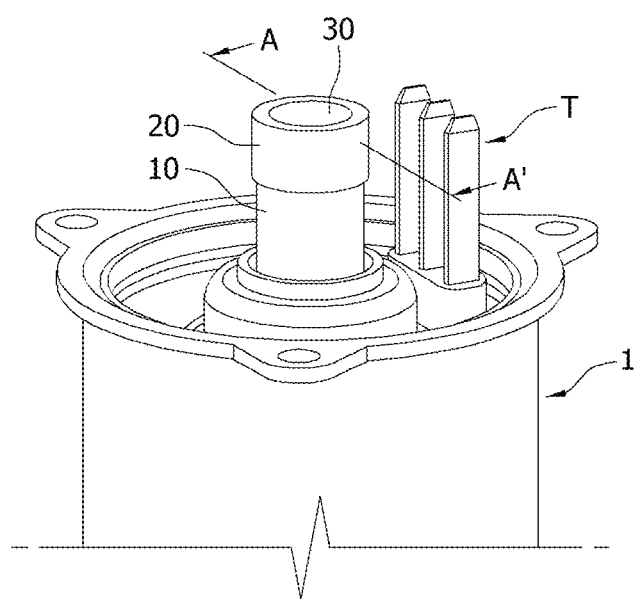
FIG. 6 is a perspective view of a motor rotation detection device according to another embodiment of the present invention.
Figure 7:
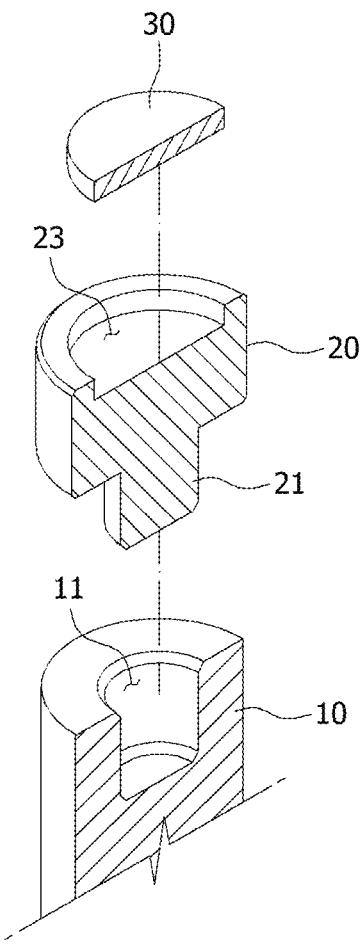
FIG. 7 is a cross-sectional perspective view taken along line A-A' in FIG. 6.
Figure 8:
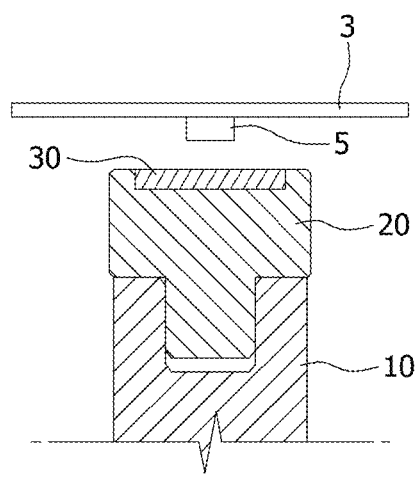
FIG. 8 shows a cross-sectional view taken along line A-A' in FIG. 6 with an ECU to which an MPS is coupled.

In FIGS. 6 to 8, a motor rotation detection device according to another embodiment of the present invention is shown. The motor rotation detection device according to another embodiment of the present invention is coupled to a rotating shaft of a motor to transmit a rotation position of the motor to an MPS 5 through magnetic flux in a non-contact manner.

Referring to FIGS. 6 to 8, the motor rotation detection device according to another embodiment of the present invention includes a holder 20 and a sensor magnet 30.

The holder 20 is coupled to one end of the rotating shaft 10 of the motor 1. In FIG. 6, the motor 1 is shown as an alternating current motor having a three-phase terminal T. In another embodiment of the present invention, the holder 20 is coupled to one end of the rotating shaft 10 to allow the sensor magnet 30 to be fixed to the rotating shaft 10.

In another embodiment of the present invention, the holder 20 is made of a non-magnetic material. Since the holder 20 is a weak magnetic material containing a steel material, when the sensor magnet 30 is disposed adjacent to the holder 20, a magnetic force weakens due to a magnetism leakage, and thus the MPS does not detect accurate information. Therefore, the holder 20 may be made of a non-magnetic material, such as brass, in which magnetism does not flow.

In another embodiment of the present invention, the holder 20 includes a protrusion 21 formed to protrude from one end thereof. To correspond to the protrusion 21, the groove 11 into which the protrusion 21 is inserted is formed in one end of the rotating shaft 10. Therefore, the protrusion 21 is inserted into the groove 11, and the holder 20 may be coupled to the rotating shaft 10. More specifically, the protrusion 21 is press-fitted into the groove 11, and the holder 20 may be coupled to the rotating shaft 10.

Further, in another embodiment of the present invention, the holder 20 includes a mounting groove 23 formed in the other end thereof so that the sensor magnet 30 is mounted therein. When the sensor magnet 30 is mounted in the mounting groove 23, the sensor magnet 30 may be fixed to the holder 20. In this case, an adhesive may be applied to a contact portion between the mounting groove 23 and the sensor magnet 30.

Figure 9:
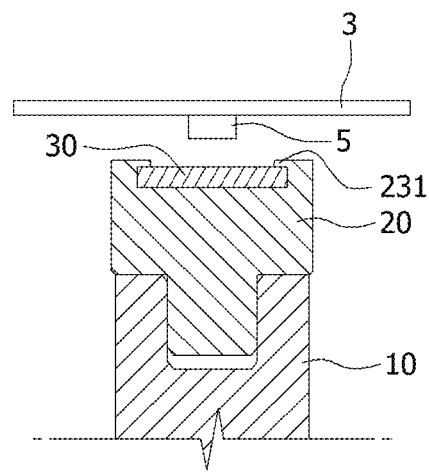
FIG. 9 is a cross-sectional view of a modified example of the motor rotation detection device according to another embodiment of the present invention.

Meanwhile, FIG. 9 shows a modified example of the motor rotation detection device according to another embodiment of the present invention. Referring to FIG. 9, in another embodiment of the present invention, a guard 231 is formed on an upper end of a mounting groove 23 to protrude inward in a radial direction so as to prevent a sensor magnet 30 from being separated from the mounting groove 23. More specifically, the guard 231 may be formed on an upper end of the mounting groove 23 in an inner flange shape. The guard 231 allows the sensor magnet 30 to be fixed without an adhesive. Further, even when an adhesive is used, the sensor magnet 30 can be more securely fixed.

In another embodiment of the present invention, the sensor magnet 30 is coupled to the other end of the holder 20 and generates magnet flux. The sensor magnet 30 transmits rotation information to the MPS 5, which is coupled to the ECU 3, through magnetic flux in a non-contact manner.

According to the embodiments of the present invention, provided is a motor rotation detection device which can be lightweight, reduce component costs, and have excellent resistance to separating due to a rigid coupling structure.

According to the embodiments of the present invention, the motor rotation detection device allows a sensor magnet to have an enlarged size so as to have an improved performance that detects a rotation position of the motor sensor magnet.

Although the embodiments of the present invention have been described above, the spirit of the present invention is not limited by the embodiments disclosed herein, and it should be understood by those skilled in the art that various changes and modifications may be made therein by addition, substitution, or removal of components without departing from the spirit and scope of the present invention as defined by the appended claims. Such changed and modified embodiments are also included within the scope of the appended claims.

What is claimed is:

1. A motor rotation detection device which is coupled to a rotating shaft of a motor to transmit a rotation position of the motor to a motor position sensor (MPS) through magnetic flux in a non-contact manner, the device comprising:
   a spacer which is disposed so that one end of the spacer is in contact with one end of the rotating shaft;
   a sensor magnet which is disposed on the other end of the spacer and generates magnetic flux; and
   a case which is coupled to the rotating shaft and provides a fixing force so that the sensor magnet and the spacer are fixed to the rotating shaft,
   wherein the spacer includes a protrusion protruding from one end of the spacer, and a groove, into which the protrusion of the space is inserted, is formed at one end of the rotating shaft.

2. The device of claim 1, wherein the spacer is made of a non-magnetic material.

3. The device of claim 1, wherein the spacer is made of an elastic material.

4. The device of claim 1, wherein the sensor magnet is disposed to cover an entirety of the other end of the spacer.

5. A motor rotation detection device which is coupled to a rotating shaft of a motor to transmit a rotation position of to a motor position sensor (MPS) through magnetic flux in a non-contact manner, the device comprising:
- a spacer which is disposed so that one end of the space is in contact with one end of the rotating shaft;
- a sensor magnet which is disposed on the other end of the spacer and generates magnetic flux; and
- a case which is coupled to the rotating shaft and provides a fixing force so that the sensor magnet and the spacer are fixed to the rotating shaft,
- wherein a guide protrusion is formed at one of the other end of the spacer and a contact surface of the sensor magnet that is in contact with the other end of the spacer, and a guide groove, into which the guide protrusion is inserted, is formed at the other end of the sensor magnet.

6. The device of claim 1, wherein the case is made of a non-magnetic metal material.

7. The device of claim 1, wherein the case includes a head part which covers one surface of the sensor magnet and a body part which extends downward from the head part and is formed to surround the sensor magnet, the spacer, and a part of the rotating shaft.

8. The device of claim 7, wherein the head part includes a window that exposes at least a part of the sensor magnet.

9. A motor rotating detection device which is coupled to a rotating shaft of a motor to transmit a rotation position of the motor to a motor position sensor (MPS) through magnetic flux in a non-contact manner, the device comprising:
- a spacer which is disposed so that one end of the spacer is in contact with one end of the rotating shaft;
- a sensor magnet which is disposed on the other end of the spacer and generates magnetic flux; and
- a case which is coupled to the rotating shaft and provides a fixing force so that the sensor magnet and the spacer are fixed to the rotating shaft, wherein:
the case includes a head part which covers one surface of the sensor magnet and a body part which extends downward from the head part and is formed to surround the sensor magnet, the spacer, and a part of the rotating shaft;
the rotating shaft includes a groove formed in a portion, which is in contact with an inner circumferential surface of the body part, of an outer circumferential surface of the rotating shaft; and
the body part includes a protrusion which is formed on a portion, which is in contact with the groove, of an inner circumferential surface of the body part and is formed to be insertion-fixable to the groove.

* * * * *